United States Patent
Ding

(10) Patent No.: US 11,867,788 B2
(45) Date of Patent: Jan. 9, 2024

(54) METHOD AND SYSTEM FOR FULL CYCLE ERROR CORRECTION OF INDUCTOR CURRENT MEASUREMENT FOR SWITCHING REGULATORS

(71) Applicant: RENESAS ELECTRONICS AMERICA INC., Milpitas, CA (US)

(72) Inventor: Michael Ding, Milpitas, CA (US)

(73) Assignee: Renesas Electronics America Inc., Milpitas, CA (US)

( * ) Notice: Subject to any disclaimer, the term of this patent is extended or adjusted under 35 U.S.C. 154(b) by 66 days.

(21) Appl. No.: 17/156,334

(22) Filed: Jan. 22, 2021

(65) Prior Publication Data

US 2021/0239781 A1 Aug. 5, 2021

Related U.S. Application Data

(60) Provisional application No. 62/967,843, filed on Jan. 30, 2020.

(51) Int. Cl.
*G01R 15/18* (2006.01)
*G01R 35/00* (2006.01)

(52) U.S. Cl.
CPC ............ *G01R 35/005* (2013.01); *G01R 15/18* (2013.01)

(58) Field of Classification Search
CPC ............................. G01R 15/18; G01R 35/005
See application file for complete search history.

(56) References Cited

U.S. PATENT DOCUMENTS

| 10,361,554 B1 | 7/2019 | Demski et al. | |
|---|---|---|---|
| 2012/0032664 A1* | 2/2012 | Coleman | H02M 3/1582 323/311 |
| 2012/0133347 A1 | 5/2012 | Cleveland et al. | |
| 2012/0139518 A1 | 6/2012 | Cleveland et al. | |

(Continued)

OTHER PUBLICATIONS

Foreign Search Report on European Application No. 21153400.3 dated Jun. 11, 2021.

*Primary Examiner* — Alesa Allgood
(74) *Attorney, Agent, or Firm* — Foley & Lardner LLP

(57) ABSTRACT

Example implementations include a method of generating a ramp down compensation voltage based at least partially on the a current sense voltage and an inductor voltage of an inductor at an inductor node, applying the ramp down compensation voltage to the inductor node, and in accordance with a first determination that the valley current sense voltage and the inductor voltage are not equal, modifying a predetermined capacitance of a system capacitor operatively coupled to the inductor node to a first modified capacitance. Example implementations also include an apparatus with a ramp-down compensator operable to generate a ramp down compensation voltage based at least partially on the a current sense voltage and an inductor voltage of an inductor at an inductor node, and to apply the ramp down compensation voltage to the inductor node, and a ramp-up compensator including a system capacitor operatively coupled to the inductor node, operatively coupled to the ramp-down compensator, and operable to, in accordance with a first determination that the valley current sense voltage and the inductor voltage are not equal, modify a predetermined capacitance of the system capacitor to a first modified capacitance.

20 Claims, 8 Drawing Sheets

(56) References Cited

U.S. PATENT DOCUMENTS

| | | |
|---|---|---|
| 2013/0200869 A1 | 8/2013 | Sasao et al. |
| 2014/0002043 A1* | 1/2014 | Li .................... H02M 3/156 |
| | | 323/282 |
| 2014/0239925 A1 | 8/2014 | Tanabe et al. |
| 2014/0266119 A1 | 9/2014 | Burton et al. |
| 2015/0069990 A1* | 3/2015 | Feldtkeller ............ H02M 3/158 |
| | | 323/284 |
| 2018/0152103 A1 | 5/2018 | Mansri et al. |

* cited by examiner

US 11,867,788 B2

METHOD AND SYSTEM FOR FULL CYCLE ERROR CORRECTION OF INDUCTOR CURRENT MEASUREMENT FOR SWITCHING REGULATORS

CROSS-REFERENCE TO RELATED PATENT APPLICATIONS

This application claims priority to U.S. Provisional Patent Application Ser. No. 62/967,843, entitled "FULL CYCLE INDUCTOR CURRENT MEASUREMENT TECHNIQUE FOR SWITCHING REGULATOR," filed Jan. 30, 2020, the contents of such application being hereby incorporated by reference in its entirety and for all purposes as if completely and fully set forth herein.

TECHNICAL FIELD

The present implementations relate generally to power regulators, and more particularly to full cycle error correction of inductor current measurement for switching regulators.

BACKGROUND

Accurate inductor current sensing is vital to accurate operation of voltage regulator systems. However, conventional systems may not effectively correct error in inductor current sensing signals across full cycle of voltage regulator operation, resulting in decreased accuracy and of the current sensing signals or resulting in increased cost and complexity of correction systems. Thus, a technological solution for full cycle error correction of inductor current measurement for switching regulators is desired.

SUMMARY

Example implementations include a method of generating a ramp down compensation voltage based at least partially on the a current sense voltage and an inductor voltage of an inductor at an inductor node, applying the ramp down compensation voltage to the inductor node, and in accordance with a first determination that the valley current sense voltage and the inductor voltage are not equal, modifying a predetermined capacitance of a system capacitor operatively coupled to the inductor node to a first modified capacitance.

Example implementations also include an apparatus with a ramp-down compensator operable to generate a ramp down compensation voltage based at least partially on the a current sense voltage and an inductor voltage of an inductor at an inductor node, and to apply the ramp down compensation voltage to the inductor node, and a ramp-up compensator including a system capacitor operatively coupled to the inductor node, operatively coupled to the ramp-down compensator, and operable to, in accordance with a first determination that the valley current sense voltage and the inductor voltage are not equal, modify a predetermined capacitance of the system capacitor to a first modified capacitance.

Example implementations also include a method of generating a ramp down compensation voltage based at least partially on the a current sense voltage and an inductor voltage of an inductor at an inductor node, applying the ramp down compensation voltage to the inductor node, in accordance with a first determination that the valley current sense voltage is greater than the inductor voltage, decreasing a capacitance of a system capacitor operatively coupled to the inductor node, and in accordance with a second determination that the valley current sense voltage is less than the inductor voltage, increasing the capacitance of the system capacitor.

BRIEF DESCRIPTION OF THE DRAWINGS

These and other aspects and features of the present implementations will become apparent to those ordinarily skilled in the art upon review of the following description of specific implementations in conjunction with the accompanying figures, wherein.

DETAILED DESCRIPTION

Figure 1:
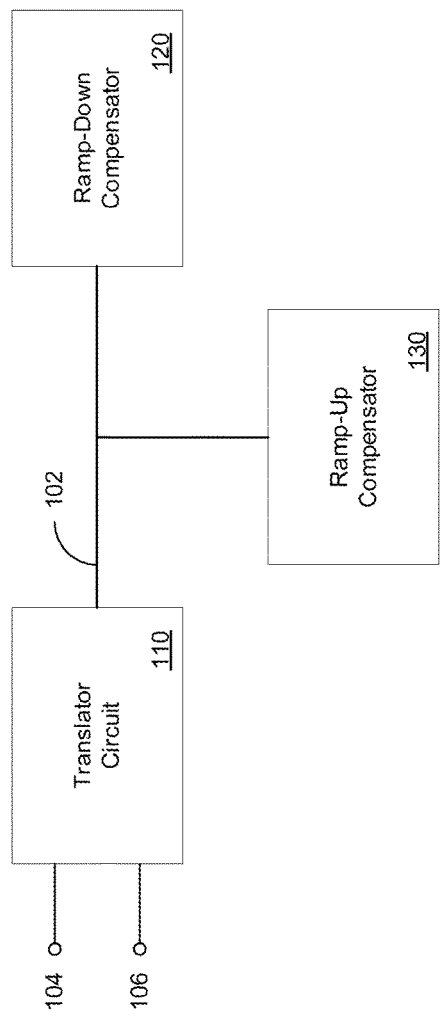
FIG. 1 illustrates an example system in accordance with present implementations.

The present implementations will now be described in detail with reference to the drawings, which are provided as illustrative examples of the implementations so as to enable those skilled in the art to practice the implementations and alternatives apparent to those skilled in the art. Notably, the figures and examples below are not meant to limit the scope of the present implementations to a single implementation, but other implementations are possible by way of interchange of some or all of the described or illustrated elements. Moreover, where certain elements of the present implementations can be partially or fully implemented using known components, only those portions of such known components that are necessary for an understanding of the present implementations will be described, and detailed descriptions of other portions of such known components will be omitted so as not to obscure the present implementations. Implementations described as being implemented in software should not be limited thereto, but can include implementations implemented in hardware, or combinations of software and hardware, and vice-versa, as will be apparent to those skilled in the art, unless otherwise specified herein. In the present specification, an implementation showing a singular component should not be considered limiting; rather, the present disclosure is intended to encompass other implementations including a plurality of the same component, and vice-versa, unless explicitly stated otherwise herein. Moreover, applicants do not intend for any term in the specification or claims to be ascribed an uncommon or special meaning unless explicitly set forth as such. Further, the present implementations encompass present and future known equivalents to the known components referred to herein by way of illustration.

It is to be understood that accurate inductor current sensing is vital to accurate operation of voltage regulator systems. Thus, in some implementations, accurate inductor current sensing is vital to operations including control operations of voltage regulators and current measurement operations governing those control operations. In some implementations, sensed current including errors introduced at the sensing device or system that must be removed, mitigated, or the like. Various processes for providing accurate inductor current sensing may introduce benefits including high accuracy, lossless measurement, and full cycle sensing. However, various processes may concurrently introduce efficiency losses at high accuracy, lower accuracy in lossless operation, specific knowledge of physical characteristics of inductors or other components, or requirements for inclusion of additional components that can increase materials or manufacturing cost. Further, in some implementations, applying a trim voltage alone to remove, mitigate, or the like, error signals from an inductor current sense voltage can distort or the like the signal. In some implementations, distortion of the inductor current sense signal can reduce or eliminate accuracy and effectiveness of that signal for inductor current sensing. Thus, it is advantageous to provide full cycle error correction of inductor current measurement for switching regulators.

FIG. 1 illustrates an example system in accordance with present implementations. As illustrated by way of example in FIG. 1, an example system 100 includes a translator circuit 110, a ramp-down compensator 120, a ramp-up compensator 130, an inductor node 102, an input node 104, and an output node 106.

The translator circuit 110 is operable to generate an uncorrected inductor voltage waveform. In some implementations, the translator circuit is operatively coupled to a voltage regulator, power, regulator, charger, or the like, at the input node 104. In some implementations, the translator circuit 110 is operable to include at least one of a current integrator device and a voltage integrator. In some implementations, the translator circuit 110 generates, receives, obtains, or the like, the uncorrected inductor voltage waveform according to Equations (1), (2) and (3):

$$d(V_L) = d(I_L)Z \qquad \text{Eqn. (1)}$$

$$I = C \frac{d(V_L)}{d(t)} \qquad \text{Eqn. (2)}$$

$$Z = \frac{V_{L,max} - V_{L,min}}{I_{L,max} - I_{L,min}} \qquad \text{Eqn. (3)}$$

In some implementations, the input node 104 receives an input uncorrected inductor current, one or more controls signals, and the like. In some implementations, the input node 104 is a single trace, line or the like associated with one or more signals in sequence. Alternatively, in some implementations, the input node 104 is or includes a plurality of traces, lines, buses, or the like, associated with one or more signal in parallel. In some implementations, the output node 106 transmits an output corrected inductor voltage, one or more controls signals, and the like. In some implementations, the output node 106 is a single trace, line or the like associated with one or more signals in sequence. Alternatively, in some implementations, the output node 106 is or includes a plurality of traces, lines, buses, or the like, associated with one or more signal in parallel. In some implementations, the translator circuit 110 includes one or more logical or electronic devices including but not limited to integrated circuits, logic gates, flip flops, gate arrays, programmable gate arrays, and the like. It is to be understood that any electrical, electronic, or like devices, or components associated with the translator circuit 110 can also be associated with, integrated with, integrable with, replaced by, supplemented by, complemented by, or the like, one or more of the ramp-down compensator 120, the ramp-up compensator 130, or any component thereof.

The ramp-down compensator 120 is operable to correct a ramp-down portion of an uncorrected inductor voltage waveform. In some implementations, the ramp-down compensator is operable to apply one or more correcting voltages to the inductor voltage waveform during a ramp-down portion of an inductor cycle. In some implementations, the ramp-down compensator 120 is operable to correct the ramp-down portion by applying a compensating feedback voltage to the inductor voltage. In some implementations, the ramp-down portion of the inductor cycle is a half cycle of a full cycle of the inductor voltage waveform of the uncorrected inductor voltage. In some implementations, the ramp-down compensator 120 includes one or more logical or electronic devices including but not limited to integrated circuits, logic gates, flip flops, gate arrays, programmable gate arrays, and the like. It is to be understood that any electrical, electronic, or like devices, or components associated with the ramp-down compensator 120 can also be associated with, integrated with, integrable with, replaced by, supplemented by, complemented by, or the like, one or more of the ramp-down compensator 120, the ramp-up compensator 130, or any component thereof.

The ramp-up compensator 130 is operable to correct a ramp-up portion of an uncorrected inductor voltage waveform. In some implementations, the ramp-up compensator is operable to apply one or more correcting voltages to the inductor voltage waveform during a ramp-up portion of an inductor cycle. In some implementations, the ramp-up compensator 130 is operable to correct the ramp-up portion by modifying capacitance of system capacitor operatively coupled to an inductor node receiving the inductor voltage. In some implementations, the ramp-up portion of the inductor cycle is another half cycle of a full cycle of the inductor voltage waveform of the uncorrected inductor voltage. In some implementations, the ramp-up compensator 130 includes one or more logical or electronic devices including but not limited to integrated circuits, logic gates, flip flops, gate arrays, programmable gate arrays, and the like. It is to be understood that any electrical, electronic, or like devices, or components associated with the ramp-up compensator 130 can also be associated with, integrated with, integrable with, replaced by, supplemented by, complemented by, or the like, one or more of the ramp-down compensator 120, the ramp-up compensator 130, or any component thereof. The inductor node 102 is operable to receive at least one of the uncorrected voltage, a corrected voltage, and a partially corrected voltage. In some implementations, the inductor node 102 operatively couples one or more of the translator circuit 110, the ramp-down compensator 120, and the ramp-up compensator 130.

Figure 2:
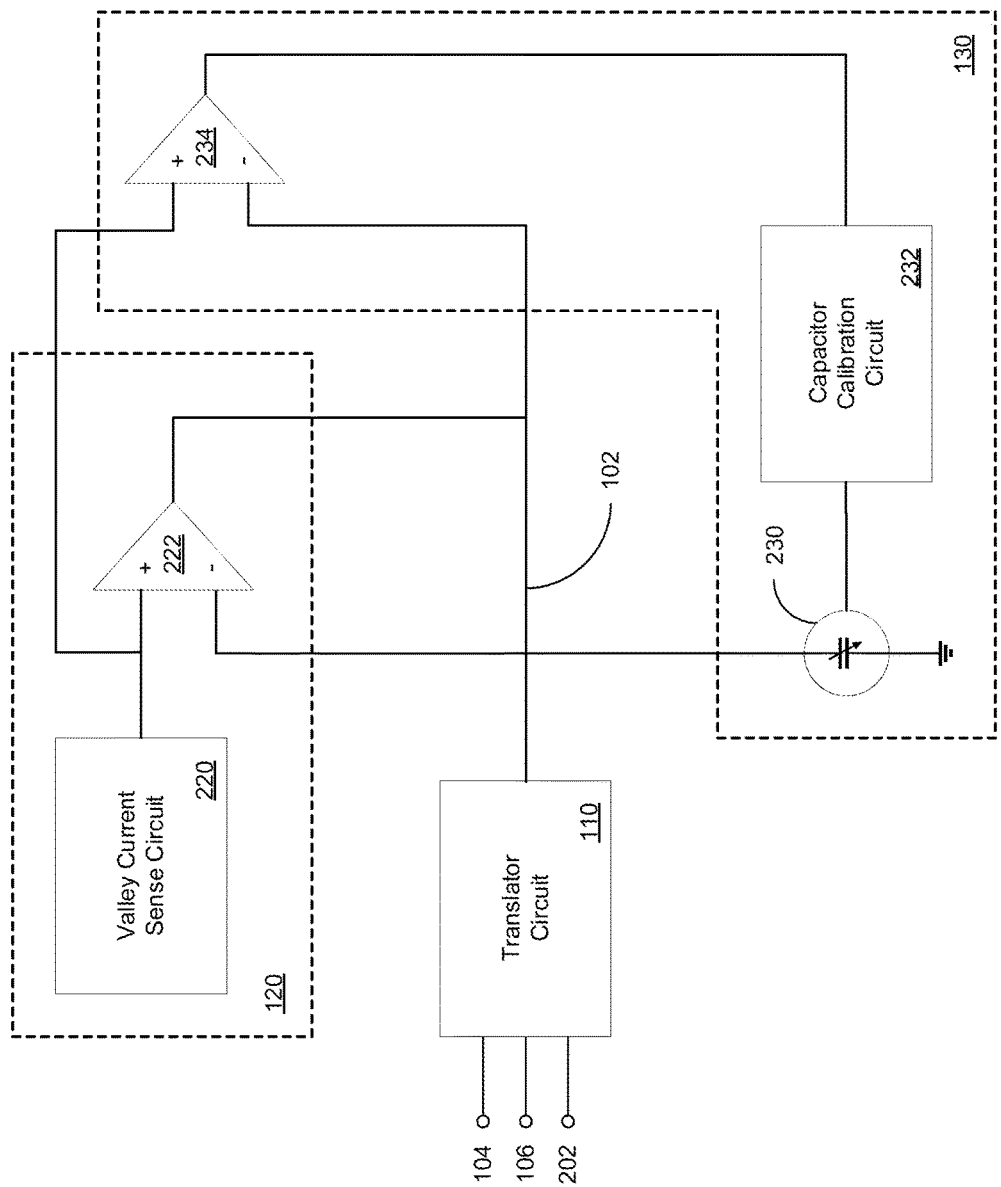
FIG. 2 illustrates an example device in accordance with present implementations.

FIG. 2 illustrates an example device in accordance with present implementations. As illustrated by way of example in FIG. 2, an example device 200 includes the translator circuit 110, the ramp-down compensator 120, the ramp-up compensator 130, the inductor node 102, and the input node 104. In some implementations, the ramp-down compensator 120 includes a valley current sense circuit 220 and a ramp-down buffer 222. In some implementations, the ramp-up compensator 130 includes a system capacitor 230, a capacitor calibration circuit 232, and a ramp-down comparator 234.

In some implementations, the input node 104 includes the input node 104, the output node 106, and a trim voltage input node 202. The trim voltage input node 202 is operable to provide a trim voltage to the translator circuit. In some implementations, the trim voltage input node 202 is operable to provide a positive or negative voltage to the translator circuit 110 to modify the corrected inductor voltage output at the output node. In some implementations, the trim voltage modifies a full cycle of the inductor voltage waveform by a scalar displacement, magnitude modification, or the like. In some implementations, the translator circuit 110 operates in accordance with a translation factor Gm. In some implementations, the input 104 corresponds to Vinput. In some implementations, the translator circuit 110 generates, applies, or the like, the translation factor Gm according to Equations (4), (5), and (6):

$$L\frac{d(I_L)}{d(t)} = V_{input} - V_{out} \qquad \text{Eqn. (4)}$$

$$\frac{d(V_L)}{d(I_L)} = \frac{I}{V_{input} - V_{out}} = \frac{L}{C} \qquad \text{Eqn. (5)}$$

$$Gm = \frac{I}{V_{input} - V_{out}} = \frac{ZC}{L} \qquad \text{Eqn. (6)}$$

The valley current sense circuit 220 is operable to generate a valley current sense voltage. In some implementations, the valley current sense voltage is or includes an offset to the uncorrected inductor voltage. In some implementations, the offset is a time-dependent or time-independent scalar value generated as a voltage. In some implementations, the offset is time-dependent or time-independent. In some implementations, the valley current sense circuit 220 includes one or more logical or electronic devices including but not limited to integrated circuits, logic gates, flip flops, gate arrays, programmable gate arrays, and the like. It is to be understood that any electrical, electronic, or like devices, or components associated with the valley current sense circuit 220 can also be associated with, integrated with, integrable with, replaced by, supplemented by, complemented by, or the like, the ramp-down compensator 120 or any component thereof.

The ramp-down buffer 222 is operable to generate a compensation voltage associated with a ramp-down portion of an inductor ramp cycle. In some implementations, the ramp-down buffer 222 includes a noninverting input operatively coupled to an output of the valley current sense circuit 220, an inverting input operatively coupled to the inductor node 102, and an output operatively coupled to the inductor node 102 by an inductor voltage feedback line. It is to be understood that any electrical, electronic, or like devices, or components associated with the ramp-down buffer 222 can also be associated with, integrated with, integrable with, replaced by, supplemented by, complemented by, or the like, the ramp-down compensator 120 or any component thereof.

The system capacitor 230 is operable to compensate a voltage associated with a ramp-up portion of an inductor ramp cycle. In some implementations, the system capacitor 230 is a variable capacitor. In some implementations, the system capacitor 230 is electronically-controlled, controllable, modifiable, settable, selectable, or the like. In some implementations, the system capacitor 230 is or includes one or more capacitors, a capacitor array, or the like. In some implementations, the system capacitor 230 is operatively coupled at a first terminal to the inductor node 102, and operatively coupled at a second terminal to ground, a reference voltage, or the like.

The capacitor calibration circuit 232 is operable to generate a compensation signal associated with a ramp-down portion of an inductor ramp cycle. In some implementations, the capacitor calibration circuit 232 is operable to generate one or more control signals and apply one or more control signals to the system capacitor 230 to modify a capacitance thereof. In some implementations, the capacitor calibration circuit includes an output operatively coupled to the system capacitor 230, and an input operatively coupled to the ramp-down comparator 234. In some implementations, the capacitor calibration circuit 232 includes one or more logical or electronic devices including but not limited to integrated circuits, logic gates, flip flops, gate arrays, programmable gate arrays, and the like. It is to be understood that any electrical, electronic, or like devices, or components associated with the capacitor calibration circuit 232 can also be associated with, integrated with, integrable with, replaced by, supplemented by, complemented by, or the like, the ramp-up compensator 232 or any component thereof.

The ramp-up comparator 234 is operable to generate a compensation voltage associated with a ramp-up portion of an inductor ramp cycle. In some implementations, the ramp-up comparator 234 includes a noninverting input operatively coupled to a noninverting input of the ramp-down buffer 222, an inverting input operatively coupled to the inductor node 102, and an output operatively coupled to capacitor calibration circuit 232. Thus, in some implementations, the ramp-up comparator 234 is arranged to correct the voltage of the inductor note 102. It is to be understood that any electrical, electronic, or like devices, or components associated with the ramp-down buffer 222 can also be associated with, integrated with, integrable with, replaced by, supplemented by, complemented by, or the like, the ramp-down compensator 120 or any component thereof.

Figure 3:
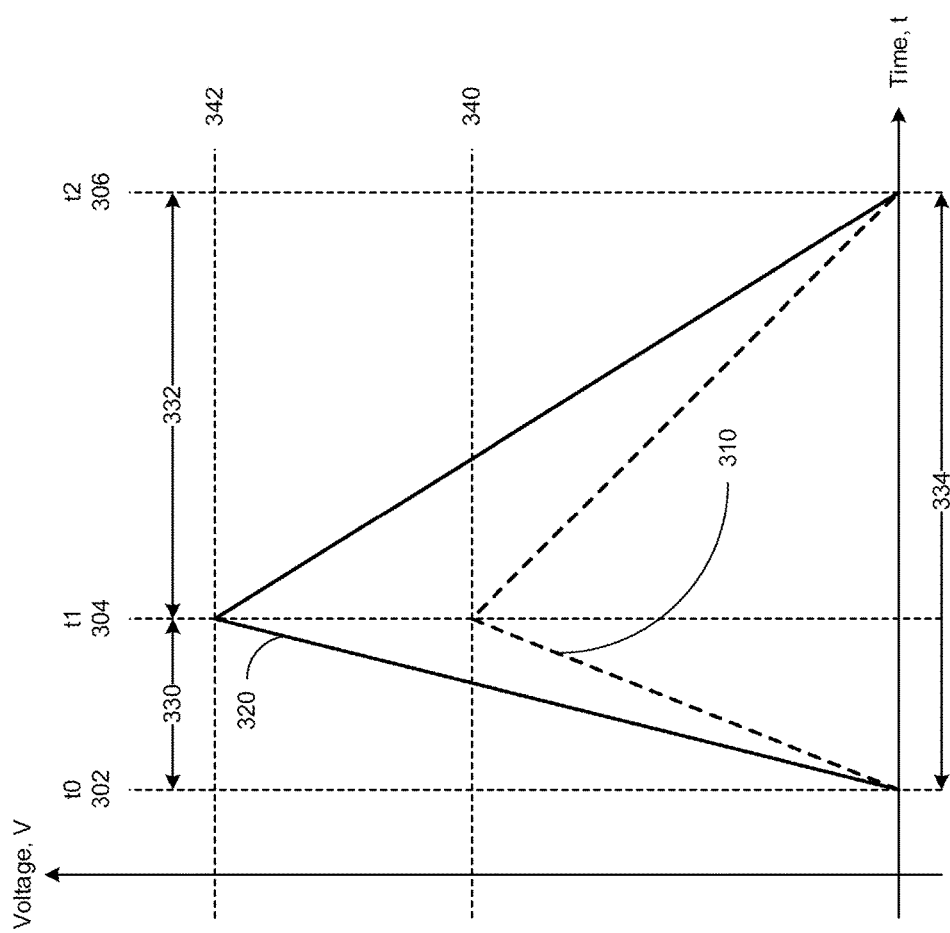
FIG. 3 illustrates a first example timing diagram including a reference corrected voltage waveform and an uncorrected voltage waveform, in accordance with present implementations.

FIG. 3 illustrates a first example timing diagram including a reference corrected voltage waveform and an uncorrected voltage waveform, in accordance with present implementations. As illustrated by way of example in FIG. 3, an example timing diagram 300 includes a reference corrected voltage waveform 310 and an uncorrected voltage waveform 320. In some implementations, the corrected voltage waveform 310 and the input voltage waveform 320 respectively reach corrected peak level 340 and uncorrected peak level 342. In some implementations, the reference corrected voltage waveform 310 and the uncorrected voltage waveform 320 are within a ramp-up period 330 and a ramp-down period 332 of a ramp cycle 334. It is to be understood that the reference corrected waveform is displayed for illustrative purposes in timing diagram 300, and need not be present concurrently with the uncorrected voltage waveform 320.

At time t0 302, the uncorrected voltage waveform 320 begins the ramp-up portion 330 of the ramp cycle 334 at a low voltage level of the ramp cycle and begins increasing toward the uncorrected peak level 342. In some implementations, the uncorrected peak level 342 is greater than the reference corrected peak level 340. In some implementations, a slope of the uncorrected voltage waveform 320 between time t0 302 and time t1 304 is greater than a corresponding slope of the reference corrected voltage waveform 310, and a magnitude of the uncorrected voltage waveform 320 between time t0 302 and time t1 304 is greater than a corresponding magnitude of the reference corrected voltage waveform 310.

At time t1 304, the uncorrected voltage waveform 320 ends the ramp-up portion 330 of the ramp cycle 334 by reaching the uncorrected peak level 342 and begins decreasing toward the low voltage level of the ramp cycle. In some implementations, a slope of the uncorrected voltage waveform 320 between time t1 304 and time t2 306 is greater than a corresponding slope of the reference corrected voltage waveform 310, and a magnitude of the uncorrected voltage waveform 320 between time t1 304 and time t2 306 is greater than a corresponding magnitude of the reference corrected voltage waveform 310.

At time t2 306, the uncorrected voltage waveform 320 reaches a low voltage level of the ramp cycle. In some implementations, where the uncorrected voltage level remains uncorrected, the uncorrected voltage waveform 320 begins increasing toward the uncorrected peak level 342 in accordance with operation at time t0 302. Alternatively, in some implementations, at time t2 306, the voltage waveform can begin a correction process in accordance with present implementations and continue to time t0 401.

Figure 4:
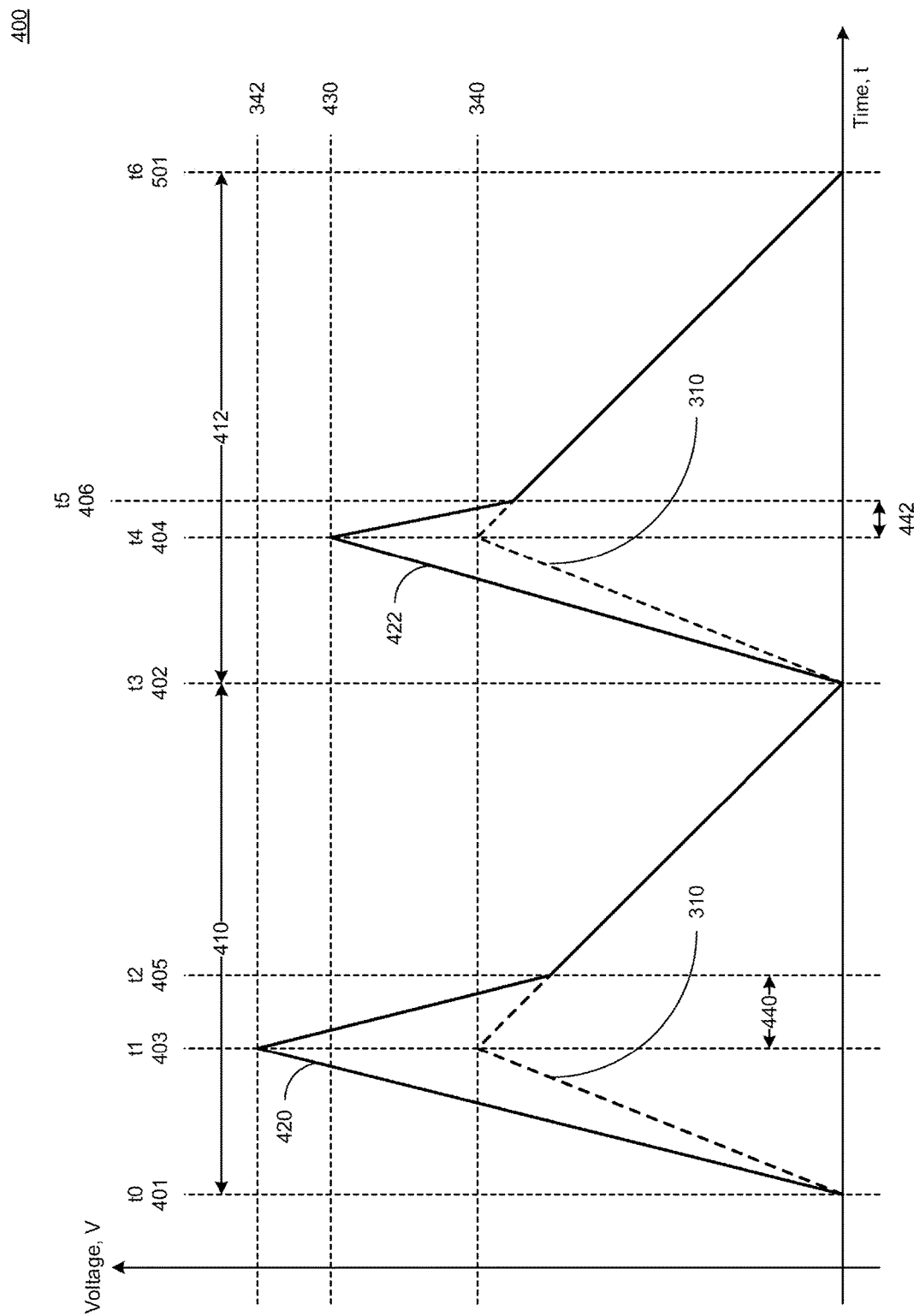
FIG. 4 illustrates a second example timing diagram including a first partially corrected voltage waveform and a second partially corrected voltage waveform, in accordance with present implementations.

FIG. 4 illustrates a second example timing diagram including a first partially corrected voltage waveform and a second partially corrected voltage waveform, in accordance with present implementations. As illustrated by way of example in FIG. 4, an example timing diagram 400 includes a first partially corrected voltage waveform 420, a second partially corrected voltage waveform 422, and a reference corrected voltage waveform 310. In some implementations, the first partially corrected voltage waveform 420, the second partially corrected voltage waveform 422, and the corrected waveform 310 respectively reach the uncorrected peak level 342, a first partially corrected peak level 430, and the corrected peak level 340. In some implementations, the first partially corrected voltage waveform 420 is within a first ramp cycle period 410, and the second partially corrected voltage waveform 422 is within a second ramp cycle period 412. In some implementations, the first ramp cycle period 410 includes a first calibration timing window 440, and the second ramp cycle period 412 includes a second calibration timing window 442. In some implementations, at least one of the example system 100, 600, and the example device iteratively performs full cycle error correction over a plurality of ramp cycles. In some implementations, the full cycle error correction iterates from an uncorrected voltage waveform 320 to a corrected voltage waveform substantially corresponding to the reference corrected voltage waveform 310. It is to be understood that the reference corrected waveform is displayed for illustrative purposes in timing diagram 400, and need not be present concurrently with the first partially corrected voltage waveform 420 and the second partially corrected voltage waveform 422.

At time t0 401, the first partially corrected voltage waveform 420 begins a ramp-up portion of the ramp cycle 410 at a low voltage level and begins increasing toward the uncorrected peak level 342. In some implementations, the uncorrected peak level 342 is greater than the reference corrected peak level 340 and the first partially corrected peak level 430. In some implementations, a slope of the first partially corrected voltage waveform 420 between time t0 401 and time t1 403 is greater than a corresponding slope of the reference corrected voltage waveform 310, and a magnitude of the first partially corrected voltage waveform 320 between time t0 401 and time t1 403 is greater than a corresponding magnitude of the reference corrected voltage waveform 310. In some implementations, the slope and magnitude of the first partially corrected voltage waveform 420 respectively correspond to the slope and magnitude of the uncorrected voltage waveform 320 between time t0 302 and time t1 304. In some implementations, no ramp-up correction is applied by the ramp-up compensator 130 or any component thereof between time t0 401 and time t2 403, as the first iteration of ramp-up compensation has not yet occurred.

At time t1 403, the first partially corrected voltage waveform 420 begins a ramp-down portion of the ramp cycle 410 and a first calibration timing window 440. In some implementations, the first partially corrected voltage waveform 420 thus reaches the uncorrected peak level 342 and begins decreasing toward a first partially corrected ramp-down level. In some implementations, the first partially corrected ramp-down level is less than the uncorrected peak level 342, the reference corrected peak level 340, and the first partially corrected peak level 430. In some implementations, a slope of the first partially corrected voltage waveform 420 between time t1 403 and time t2 405 is greater than a corresponding slope of the reference corrected voltage waveform 310, and a magnitude of the first partially corrected voltage waveform 420 between time t1 403 and time t3 405 is greater than a corresponding magnitude of the reference corrected voltage waveform 310. In some implementations, the slope of the first partially corrected voltage waveform 420 between time t1 403 and t1 405 is greater than the corresponding slope of the uncorrected voltage waveform 320 between time t1 304 and time t2 306.

At time t2 405, the first partially corrected voltage waveform 420 begins a corrected ramp-down portion of the ramp cycle 410 and exits the first calibration timing window 440. In some implementations, the first partially corrected voltage waveform 420 thus continues decreasing from the first partially corrected ramp-down level toward the low voltage level of the ramp cycle. In some implementations, a slope of the first partially corrected voltage waveform 420 between time t2 405 and time t3 402 substantially corresponds to or is substantially equal to a corresponding slope of the reference corrected voltage waveform 310, and a magnitude of the first partially corrected voltage waveform 420 between time t3 405 and time t3 402 substantially corresponds to or is substantially equal to a corresponding magnitude of the reference corrected voltage waveform 310.

At time t3 402, the second partially corrected voltage waveform 422 begins a ramp-up portion of the ramp cycle 412 from a low voltage level and begins increasing toward the first partially corrected peak level 430. In some implementations, a slope of the second partially corrected voltage waveform 422 between time t3 402 and time t4 404 is greater than a corresponding slope of the reference corrected voltage waveform 310 and less than a corresponding slope of the uncorrected voltage waveform 320. In some implementations, a magnitude of the second partially corrected voltage waveform 422 between time t3 402 and time t4 404 is greater than a corresponding magnitude of the reference corrected voltage waveform 310 and less than a corresponding magnitude of the uncorrected voltage waveform 320. In some implementations, a first ramp-up correction is applied by the ramp-up compensator 130 or any component thereof between time t3 402 and time t4 404, in response to a first iteration of ramp-up compensation thereby. In some implementations, the ramp-up compensation is applied at least between time t3 402 and time t4 404 in response to a measurement or the like of the first partially corrected voltage waveform 420 within the first calibration timing window 440.

At time t4 404, the second partially corrected voltage waveform 422 begins a ramp-down portion of the ramp cycle 412 and a second calibration timing window 442. In some implementations, the second partially corrected voltage waveform 422 thus reaches the first partially corrected peak level 430 and begins decreasing toward a second partially corrected ramp-down level. In some implementations, the second partially corrected ramp-down level is less than the uncorrected peak level 342, the reference corrected peak level 340, and the first partially corrected peak level 430. In some implementations, a slope of the second partially corrected voltage waveform 422 between time t4 404 and time t5 406 is greater than a corresponding slope of the reference corrected voltage waveform 310, and a magnitude of the second partially corrected voltage waveform 422 between time t4 404 and time t5 406 is greater than a corresponding magnitude of the reference corrected voltage waveform 310. In some implementations, the slope of the second partially corrected voltage waveform 422 between time t4 404 and t5 406 is greater than the corresponding slope of the uncorrected voltage waveform 320 between time t1 304 and time t2 306.

At time t5 406, the second partially corrected voltage waveform 422 begins a corrected ramp-down portion of the ramp cycle 412 and exits the second calibration timing window 442. In some implementations, the second partially corrected voltage waveform 422 thus continues decreasing from the second partially corrected ramp-down level toward the low voltage level of the ramp cycle. In some implementations, a slope of the second partially corrected voltage waveform 422 between time t5 406 and time t6 501 substantially corresponds to or is substantially equal to a corresponding slope of the reference corrected voltage waveform 310, and a magnitude of the second partially corrected voltage waveform 422 between time t5 406 and time t6 501 substantially corresponds to or is substantially equal to a corresponding magnitude of the reference corrected voltage waveform 310. In some implementations, the second calibration timing window 442 has a smaller period than the first calibration timing window 440, in response to a reduced error of the second partially corrected voltage waveform with respect to the first partially corrected voltage waveform 420.

Figure 5:
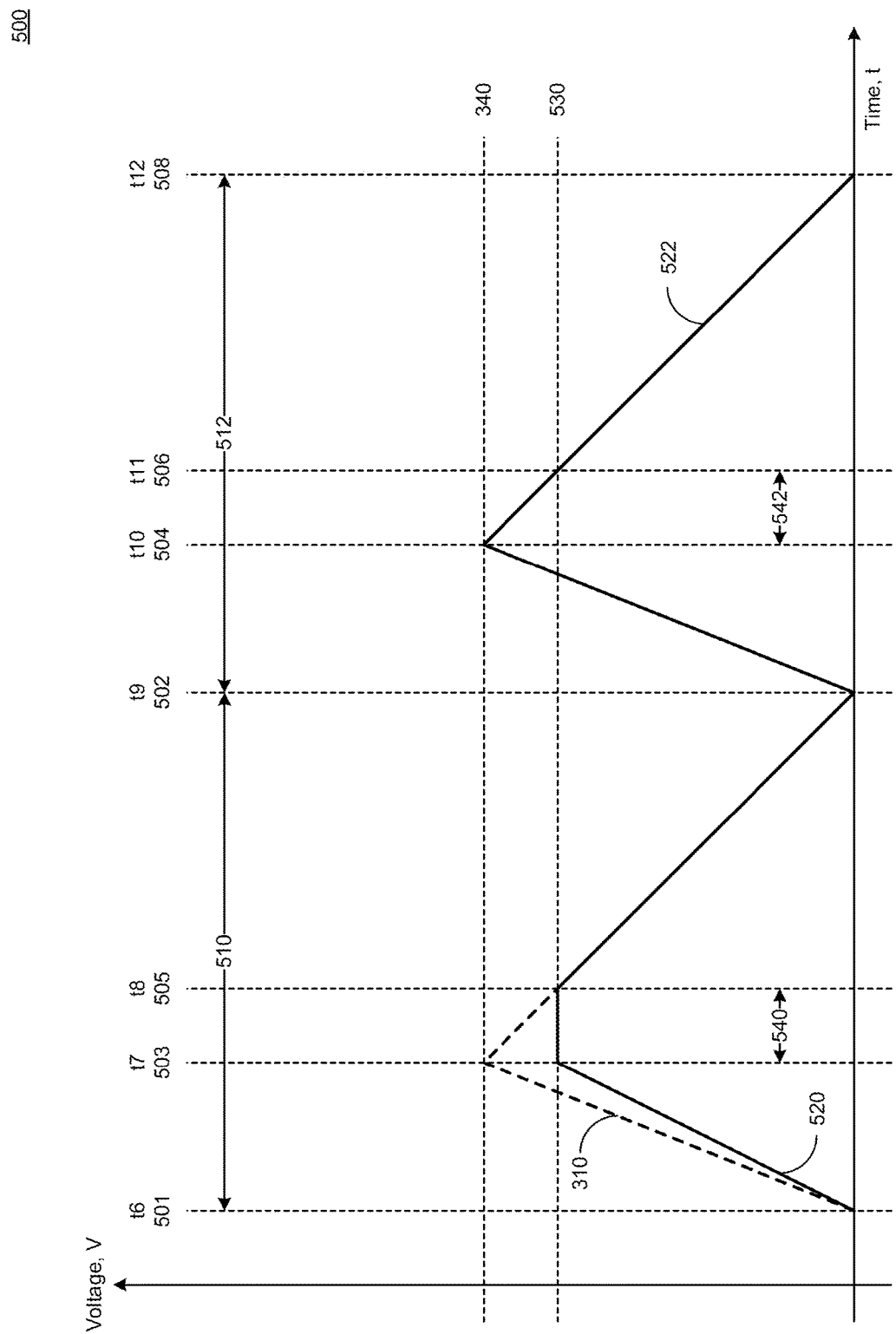
FIG. 5 illustrates a third example timing diagram including a third partially corrected voltage waveform and a corrected voltage waveform, further to the example timing diagram of FIG. 4.

FIG. 5 illustrates a third example timing diagram including a third partially corrected voltage waveform and a corrected voltage waveform, further to the example timing diagram of FIG. 4. As illustrated by way of example in FIG. 5, an example timing diagram 500 includes a third partially corrected voltage waveform 520, a corrected voltage waveform 522, and a reference corrected voltage waveform 310. In some implementations, the third partially corrected voltage waveform 520 reaches a second partially corrected peak level 530. In some implementations, the corrected voltage waveform 522 and the reference corrected waveform 310 reach corrected peak level 340. In some implementations, the third partially corrected voltage waveform 520 is within a third ramp cycle period 510, and the corrected voltage waveform 522 is within a fourth ramp cycle period 512. In some implementations, the third ramp cycle period 510 includes a third calibration timing window 540, and the fourth ramp cycle period 512 includes a fourth calibration timing window 542. It is to be understood that the reference corrected waveform is displayed for illustrative purposes in timing diagram 500, and need not be present concurrently with the third partially corrected voltage waveform 520 and the corrected voltage waveform 522.

At time t6 501, the third partially corrected voltage waveform 520 begins a ramp-up portion of the ramp cycle 510 from a low voltage level and begins increasing toward the second partially corrected peak level 530. In some implementations, a slope of the third partially corrected voltage waveform 520 between time t6 501 and time t7 503 is less than a corresponding slope of the reference corrected voltage waveform 310 and less than a corresponding slope of the uncorrected voltage waveform 320. In some implementations, a magnitude of the third partially corrected voltage waveform 520 between time t6 501 and time t7 503 is less than a corresponding magnitude of the reference corrected voltage waveform 310 and less than a corresponding magnitude of the uncorrected voltage waveform 320. In some implementations, a second ramp-up correction is applied by the ramp-up compensator 130 or any component thereof between time t6 501 and time t7 503, in response to a second iteration of ramp-up compensation thereby. In some implementations, the ramp-up compensation is applied at least between time t6 501 and time t7 503 in response to a measurement or the like of the second partially corrected voltage waveform 422 within the second calibration timing window 442. In some implementations, the third partially corrected voltage waveform 502 represents an iteration including an overcorrection of the second partially corrected voltage waveform 422.

At time t7 503, the third partially corrected voltage waveform 502 begins a ramp-down portion of the ramp cycle 510 and a third calibration timing window 540. In some implementations, the third partially corrected voltage waveform 520 thus reaches the second partially corrected peak level 530 and substantially maintains the second partially corrected peak level 530. In some implementations, because the second partially corrected peak level 530 is below the reference corrected peak level 340, the third partially corrected voltage waveform does not begin decreasing further. In some implementations, the second partially corrected peak level 530 is less than the uncorrected peak level 342 and the first partially corrected peak level 430, and is substantially equal to or substantially corresponds to the reference corrected peak level 340. In some implementations, a slope of the third partially corrected voltage waveform 520 between time t7 503 and t8 505 is substantially zero, and a magnitude of the third partially corrected voltage waveform 520 between time t7 503 and t8 505 is less than a corresponding magnitude of the reference corrected voltage waveform 310.

At time t8 505, third partially corrected voltage waveform 520 begins a corrected ramp-down portion of the ramp cycle 510 and exits the third calibration timing window 540. In some implementations, the third partially corrected voltage waveform 520 begins decreasing from the third partially corrected ramp-down level toward the low voltage level of the ramp cycle. In some implementations, a slope of the third partially corrected voltage waveform 520 between time t8 505 and time t9 502 substantially corresponds to or is substantially equal to a corresponding slope of the reference corrected voltage waveform 310, and a magnitude of the third partially corrected voltage waveform 520 between time t8 505 and time t9 502 substantially corresponds to or is substantially equal to a corresponding magnitude of the reference corrected voltage waveform 310.

At time t9 502, the corrected voltage waveform 522 begins a ramp-up portion of the ramp cycle 512 from a low voltage level and begins increasing toward the reference corrected peak level 340. In some implementations, a slope of the corrected voltage waveform 522 between time t9 502 and t10 504 substantially corresponds to or is substantially equal to a corresponding slope of the reference corrected voltage waveform 310 and less than a corresponding slope of the uncorrected voltage waveform 320. In some implementations, a magnitude of the corrected voltage waveform 522 between time t9 502 and t10 504 substantially corresponds to or is substantially equal to a corresponding magnitude of the reference corrected voltage waveform 310 and less than a corresponding magnitude of the uncorrected voltage waveform 320. In some implementations, a third ramp-up correction is applied by the ramp-up compensator 130 or any component thereof between time t9 502 and t10 504, in response to a third iteration of ramp-up compensation thereby. In some implementations, the ramp-up compensation is applied at least between time t9 502 and t10 504 in response to a measurement or the like of the third partially corrected voltage waveform 520 within the third calibration timing window 540. In some implementations, the corrected voltage waveform 522 represents an iteration including an accurate correction of the second partially corrected voltage waveform 422.

At time t10 504, the corrected voltage waveform 552 begins a ramp-down portion of the ramp cycle 512 and a fourth calibration timing window 542. In some implementations, the th corrected voltage waveform 522 thus reaches the reference corrected peak level 340 and substantially begins decreasing toward the low voltage level of the ramp cycle. In some implementations, a slope of the corrected voltage waveform 522 between time t10 504 and time t11 506 substantially corresponds to or is substantially equal to a corresponding magnitude of the reference corrected voltage waveform 310.

At time t11 506, the corrected voltage waveform continues decreasing toward the low voltage level of the ramp cycle. In some implementations, the slope and magnitude of the corrected voltage waveform 522 between time t11 and time t12 respectively substantially correspond to or are respectively substantially equal to corresponding slope and magnitude of the reference corrected voltage waveform 310. At time t12 508, the corrected voltage waveform 522 reaches a low voltage level of the ramp cycle. In some implementations, where the corrected voltage level remains corrected, and no further modifying iterations are made to a system capacitor, the corrected voltage waveform 522 begins increasing toward the reference corrected peak level 340 in accordance with operation at time t9 502.

Figure 6:
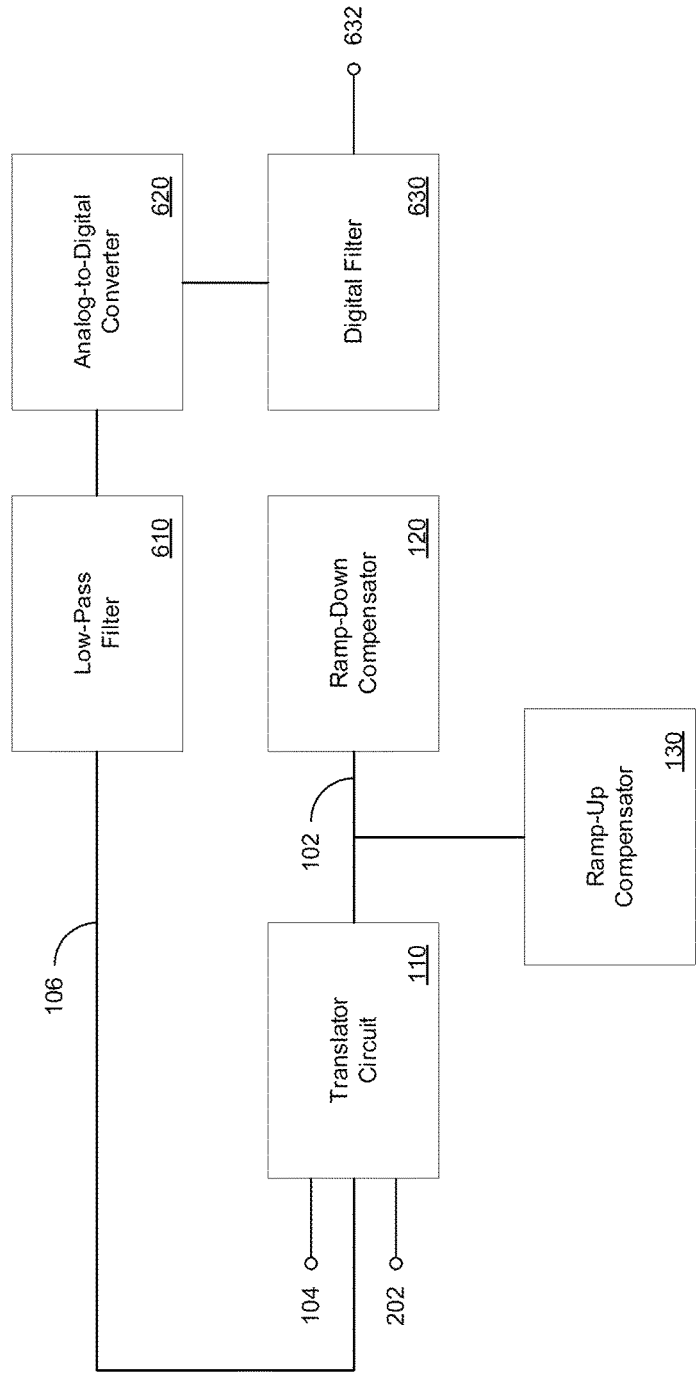
FIG. 6 illustrates a further example system in accordance with present implementations.

FIG. 6 illustrates a further example system in accordance with present implementations. As illustrated by way of example in FIG. 6, an example system 600 includes the translator circuit 110, the ramp-down compensator 120, the ramp-up compensator 130, the inductor node 102, the input node 104, a low-pass filter 610, an analog-to-digital converter 620, a digital filter 630, and an output node 632.

The low-pass filter 610 is operable to minimize analog noise in a corrected inductor voltage. In some implementations, the low-pass filter 610 includes an input operatively coupled to the output 106, and an output operatively coupled to an input of the analog-to-digital converter 620. In some implementations, the low-pass filter 610 includes one or more logical or electronic devices including but not limited to integrated circuits, logic gates, flip flops, gate arrays, programmable gate arrays, and the like. It is to be understood that any electrical, electronic, or like devices, or components associated with the low-pass filter 610 can also be associated with, integrated with, integrable with, replaced by, supplemented by, complemented by, or the like, one or more other components of the example system 600 or any component thereof.

The analog-to-digital converter 620 is operable to convert the received corrected voltage or the filtered corrected voltage to a digital corrected voltage. In some implementations, the digital corrected voltage is a quantized waveform. In some implementations, the analog-to-digital converter 620 includes an input operatively coupled to the low-pass filter 610 and an output operatively coupled to a digital filter 630. In some implementations, the analog-to-digital converter 620 includes one or more logical or electronic devices including but not limited to integrated circuits, logic gates, flip flops, gate arrays, programmable gate arrays, and the like. It is to be understood that any electrical, electronic, or like devices, or components associated with the analog-to-digital converter 620 can also be associated with, integrated with, integrable with, replaced by, supplemented by, complemented by, or the like, one or more other components of the example system 600 or any component thereof.

The digital filter 630 is operable to minimize digital noise in a digital corrected inductor voltage. In some implementations, the digital filter 630 includes an out operatively coupled to the output 632, and an input operatively coupled to an output of the analog-to-digital converter 620. In some implementations, the digital filter 630 includes one or more logical or electronic devices including but not limited to integrated circuits, logic gates, flip flops, gate arrays, programmable gate arrays, and the like. It is to be understood that any electrical, electronic, or like devices, or components associated with the digital filter 630 can also be associated with, integrated with, integrable with, replaced by, supplemented by, complemented by, or the like, one or more other components of the example system 600 or any component thereof.

Figure 7:
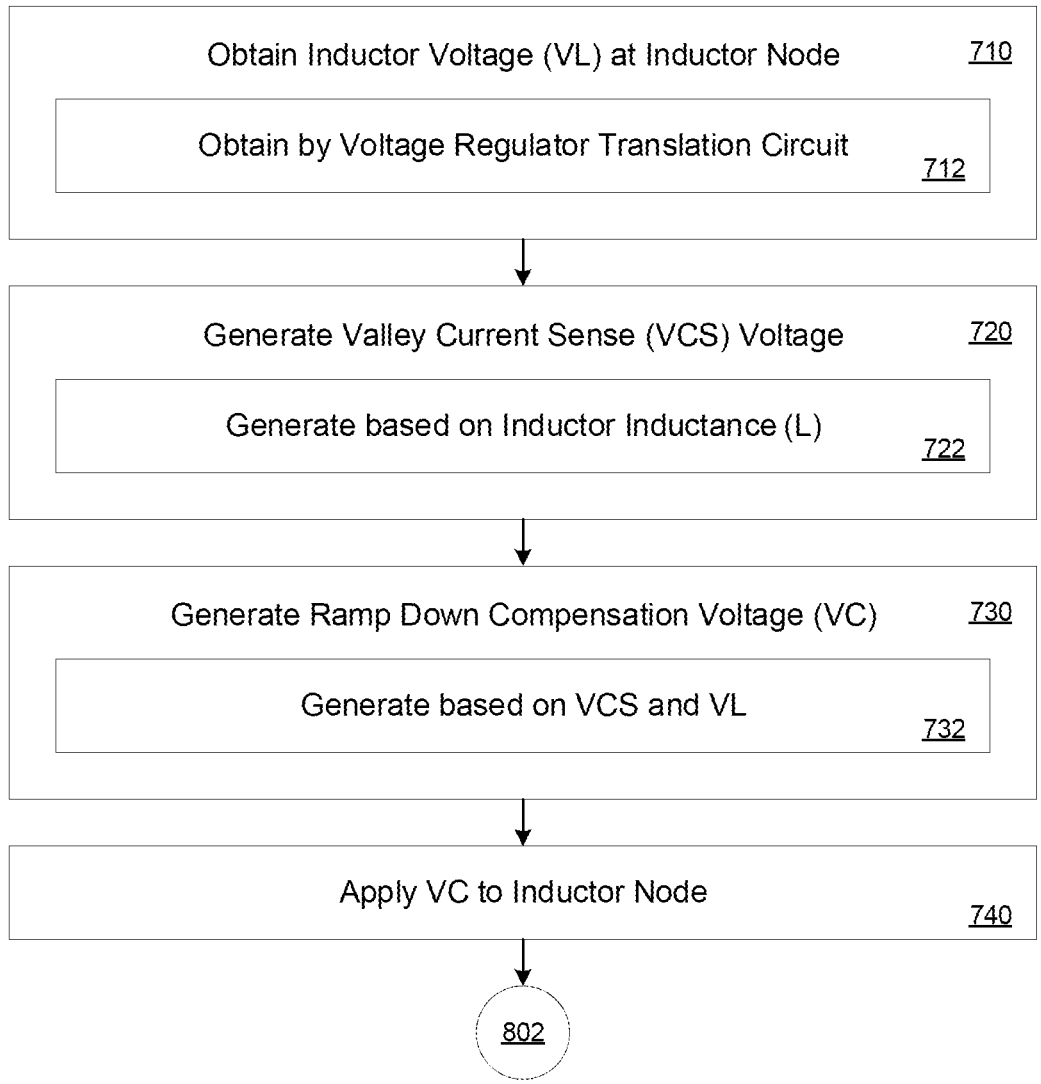
FIG. 7 illustrates an example method of full cycle error correction of inductor current measurement for switching regulators, in accordance with present implementations.

FIG. 7 illustrates an example method of full cycle error correction of inductor current measurement for switching regulators, in accordance with present implementations. In some implementations, at least one of the example systems 100 and 600, and the example device 200 performs method 700 according to present implementations. In some implementations, the method 700 begins at step 710.

At step 710, the example system obtains an inductor voltage at an inductor node. In some implementations, at least one of the ramp-down compensator 120 and the ramp-up compensator 130 obtains the inductor voltage. In some implementations, step 710 includes step 712. At step 712, the example system obtains the inductor voltage by a translation circuit operably coupled to a voltage regulator. The method 700 then continues to step 720. At step 720, the example system generates a valley current sense voltage. In some implementations, at least one of the ramp-down compensator 120 and the valley current sense circuit 220 generates the valley current sense voltage. In some implementations, step 720 includes step 722. At step 722, the example system generates a valley current sense voltage based on an inductance at an inductor operatively coupled to the inductor node. The method 700 then continues to step 730. At step 730, the example system generates a ramp-down compensation voltage. In some implementations, at least one of the ramp-down compensator 120 and the ramp-down buffer 222 generates the ramp-down compensation voltage. In some implementations, step 730 includes step 732. At step 732, the example system generates the ramp-down compensation voltage based on at least one of the valley current sense voltage and the inductor voltage. The method 700 then continues to step 740. At step 740, the example system applies the ramp-down compensation voltage to the inductor node. In some implementations, at least one of the ramp-down compensator 120 and the ramp-down buffer 222 applies the ramp-down compensation voltage by a feedback line. The method 700 then continues to step 802.

Figure 8:
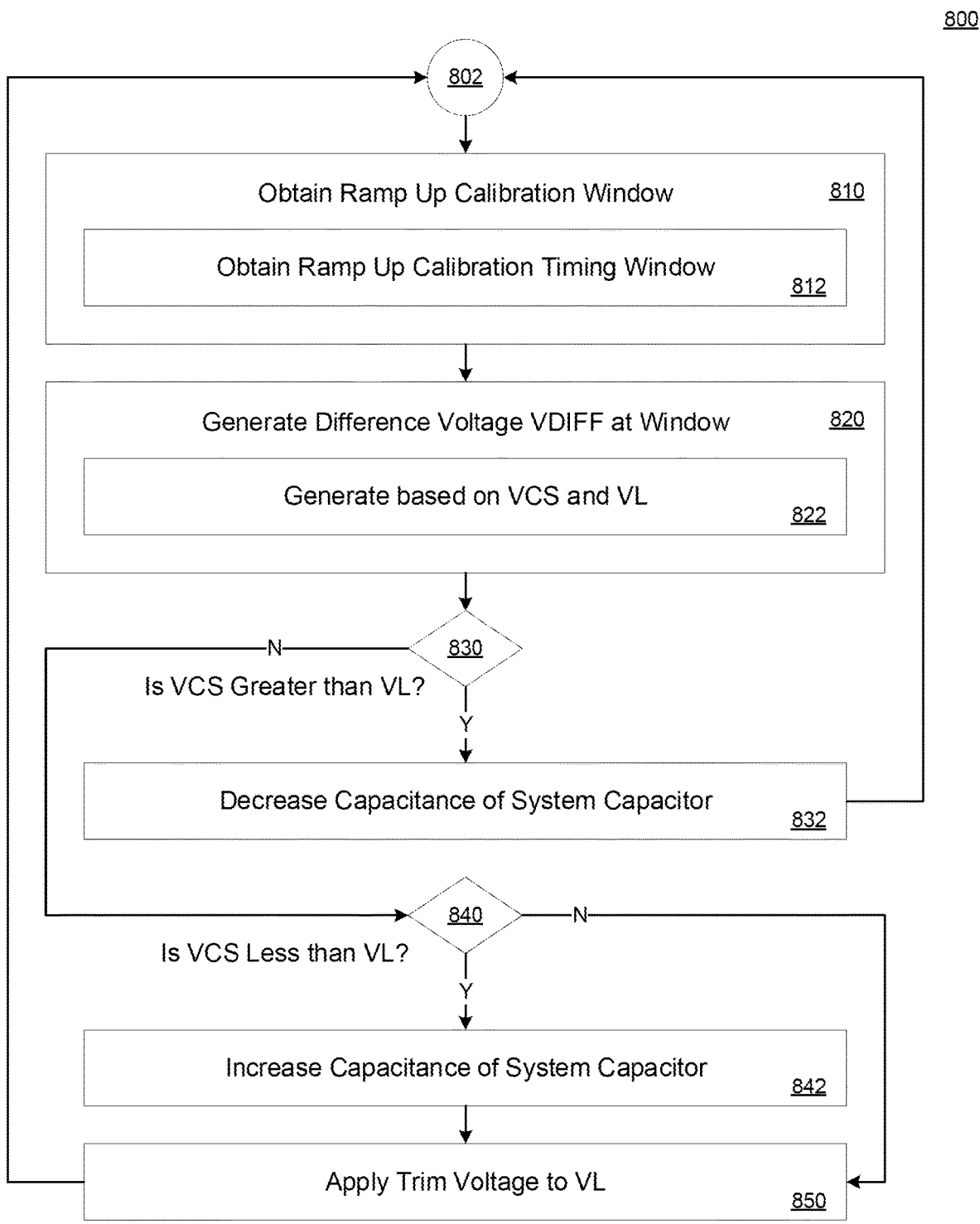
FIG. 8 illustrates an example method of full cycle error correction of inductor current measurement for switching regulators further to the example method of FIG. 8.

FIG. 8 illustrates an example method of full cycle error correction of inductor current measurement for switching regulators further to the example method of FIG. 8. In some implementations, at least one of the example systems 100 and 600, and the example device 200 performs method 800 according to present implementations. In some implementations, the method 800 begins at step 802. At step 802, the method 800 continues to step 810.

At step 810, the example system obtains a ramp-up calibration window. In some implementations, at least one of the ramp-up compensator 130 and the capacitor calibration circuit 232 obtains the ramp-up calibration window. In some implementations, step 810 includes step 812. At step 812, the example system obtains a ramp-up calibration timing window. The method 800 then continues to step 820.

At step 820, the example system generates a difference voltage associated with the calibration window. In some implementations, at least one of the ramp-up compensator 130 and the capacitor calibration circuit 232 generates the difference voltage. In some implementations, step 820 includes step 822. At step 822, the example system generates the difference voltage based at least partially on at least one of the valley current sense voltage and the inductor voltage. The method 800 then continues to step 830.

At step 830, the example system determines whether the valley current sense voltage is greater than the inductor voltage. In some implementations, the ramp-down buffer 222 determines whether the valley current sense voltage is greater than the inductor voltage. In accordance with a determination that the valley current sense voltage is greater than the inductor voltage, the method 800 continues to step 832. Alternatively, in accordance with a determination that the valley current sense voltage is not greater than the inductor voltage, the method 800 continues to step 840. At step 832, the example system decreases capacitance of a system capacitor. In some implementations, at least one of the ramp-up compensator 130 and the capacitor calibration circuit 232 decreases the capacitance of the system capacitor 230. The method 800 then continues to step 802.

At step 840, the example system determines whether the valley current sense voltage is less than the inductor voltage. In some implementations, the ramp-down buffer 222 determines whether the valley current sense voltage is greater than the inductor voltage. In some implementations, the ramp-down buffer 222 determines whether the valley current sense voltage is less than the inductor voltage. In accordance with a determination that the valley current sense voltage is less than the inductor voltage, the method 800 continues to step 842. Alternatively, in accordance with a determination that the valley current sense voltage is not less than the inductor voltage, the method 800 continues to step 850. At step 842, the example system increases capacitance of the system capacitor. In some implementations, at least one of the ramp-up compensator 130 and the capacitor calibration circuit 232 increases the capacitance of the system capacitor 230. The method 800 then continues to step 850.

At step 850, the example system applies a trim voltage to the inductor voltage. In some implementations, the translator circuit 110 applies the trim voltage to the inductor voltage. The method 800 then continues to step 802. Alternatively, in some implementations, the method 800 ends at step 850. It is to be understood that the example system can optionally perform step 850.

The herein described subject matter sometimes illustrates different components contained within, or connected with, different other components. It is to be understood that such depicted architectures are illustrative, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.).

Although the figures and description may illustrate a specific order of method steps, the order of such steps may differ from what is depicted and described, unless specified differently above. Also, two or more steps may be performed concurrently or with partial concurrence, unless specified differently above. Such variation may depend, for example, on the software and hardware systems chosen and on designer choice. All such variations are within the scope of the disclosure. Likewise, software implementations of the described methods could be accomplished with standard programming techniques with rule-based logic and other logic to accomplish the various connection steps, processing steps, comparison steps, and decision steps.

It will be further understood by those within the art that if a specific number of an introduced claim recitation is intended, such an intent will be explicitly recited in the claim, and in the absence of such recitation, no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations).

Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general, such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

Further, unless otherwise noted, the use of the words "approximate," "about," "around," "substantially," etc., mean plus or minus ten percent.

The foregoing description of illustrative implementations has been presented for purposes of illustration and of description. It is not intended to be exhaustive or limiting with respect to the precise form disclosed, and modifications and variations are possible in light of the above teachings or may be acquired from practice of the disclosed implementations. It is intended that the scope of the invention be defined by the claims appended hereto and their equivalents.

What is claimed is:

1. A method of for full cycle error correction of inductor current measurement for switching regulators, the method comprising:
    generating a ramp down compensation voltage based at least partially on a valley current sense voltage and an inductor voltage of an inductor at an inductor node;
    applying the ramp down compensation voltage to the inductor node;
    in response to a first determination that the valley current sense voltage and the inductor voltage are not equal, applying a control signal to a system capacitor; and
    in response to the applying the control signal, modifying to a first modified capacitance a predetermined capacitance of the system capacitor, the system capacitor operatively coupled at a first terminal to the inductor node and at a second terminal to a reference voltage.

2. The method of claim 1, wherein the first determination that the valley current sense voltage and the inductor voltage are not equal comprises a determination that the valley current sense voltage is greater than the inductor voltage, and the first modified capacitance is less than the predetermined capacitance of the system capacitor.

3. The method of claim 1, wherein the first determination that the valley current sense voltage and the inductor voltage are not equal comprises a determination that the valley current sense voltage is less than the inductor voltage, and the first modified capacitance is greater than the predetermined capacitance of the system capacitor.

4. The method of claim 1, further comprising:
    in accordance with a second determination that the valley current sense voltage and the inductor voltage are not equal, modifying a predetermined capacitance of a system capacitor operatively coupled to the inductor node to a second modified capacitance.

5. The method of claim 4, wherein the second determination that the valley current sense voltage and the inductor voltage are not equal comprises a determination that the valley current sense voltage is greater than the inductor voltage, and the second modified capacitance is less than the predetermined capacitance of the system capacitor.

6. The method of claim 4, wherein the second determination that the valley current sense voltage and the inductor voltage are not equal comprises a determination that the valley current sense voltage is less than the inductor voltage, and the modifying the capacitance of the system capacitor comprises increasing the capacitance of the system capacitor.

7. The method of claim 1, further comprising:
    generating the valley current sense voltage based at least partially on an inductance of the inductor.

8. The method of claim 1, further comprising:
    obtaining the valley current sense voltage and the inductor voltage within a calibration timing window.

9. The method of claim 1, further comprising:
    generating a difference voltage based at least partially on the valley current sense voltage and the inductor voltage,
    wherein the first determination that the valley current sense voltage and the inductor voltage are not equal comprises a determination that the difference voltage is not equal to zero.

10. The method of claim 1, further comprising:
    applying a trim voltage to the inductor voltage.

11. A apparatus comprising:
    a ramp-down compensator operable to generate a ramp down compensation voltage based at least partially on a valley current sense voltage and an inductor voltage of an inductor at an inductor node, and to apply the ramp down compensation voltage to the inductor node; and
    a ramp-up compensator including a system capacitor operatively coupled at a first terminal to the inductor node and at a second terminal to a reference voltage, the ramp-up compensator operatively coupled to the ramp-down compensator, and operable to, in accordance with a first determination that the valley current sense voltage and the inductor voltage are not equal, apply a control signal to the system capacitor, and, in response to the application of the control signal, modify a predetermined capacitance of the system capacitor to a first modified capacitance.

12. The apparatus of claim 11, wherein the first determination that the valley current sense voltage and the inductor voltage are not equal comprises a determination that the valley current sense voltage is greater than the inductor voltage, and the first modified capacitance is less than the predetermined capacitance of the system capacitor.

13. The apparatus of claim 11, wherein the first determination that the valley current sense voltage and the inductor voltage are not equal comprises a determination that the valley current sense voltage is less than the inductor voltage, and the first modified capacitance is greater than the predetermined capacitance of the system capacitor.

14. The apparatus of claim 11, wherein the ramp-up compensator is further operable to, in accordance with a second determination that the valley current sense voltage and the inductor voltage are not equal, modify a predetermined capacitance of a system capacitor operatively coupled to the inductor node to a second modified capacitance.

15. The apparatus of claim 14, wherein the second determination that the valley current sense voltage and the inductor voltage are not equal comprises a determination that the valley current sense voltage is greater than the inductor voltage, and the second modified capacitance is less than the predetermined capacitance of the system capacitor.

16. The apparatus of claim 14, wherein the second determination that the valley current sense voltage and the inductor voltage are not equal comprises a determination that the valley current sense voltage is less than the inductor voltage, and the second modified capacitance is greater than the predetermined capacitance of the system capacitor.

17. The apparatus of claim 11, wherein the ramp-down compensator is further operable to generate the valley current sense voltage based at least partially on an inductance of the inductor.

18. The apparatus of claim 11, wherein the ramp-up compensator is further operable to generate a difference voltage based at least partially on the valley current sense voltage and the inductor voltage, and wherein the first determination that the valley current sense voltage and the inductor voltage are not equal comprises a determination that the difference voltage is not equal to zero.

19. The method of claim 11, further comprising:
a translator circuit operatively coupled to the ramp-down compensator and the ramp-up compensator, and operable to apply a trim voltage to the inductor voltage.

20. A method of for full cycle error correction of inductor current measurement for switching regulators, the method comprising:
generating a ramp down compensation voltage based at least partially on a valley current sense voltage and an inductor voltage of an inductor at an inductor node;
applying the ramp down compensation voltage to the inductor node;
in accordance with a first determination that the valley current sense voltage is greater than the inductor voltage, decreasing by a control signal a capacitance of a system capacitor, the system capacitor operatively coupled at a first terminal to the inductor and at a second terminal to a reference voltage; and
in accordance with a second determination that the valley current sense voltage is less than the inductor voltage, increasing by the control signal the capacitance of the system capacitor.

* * * * *